US011562927B2

(12) United States Patent
Dutartre et al.

(10) Patent No.: US 11,562,927 B2
(45) Date of Patent: Jan. 24, 2023

(54) METHOD FOR FORMING AN ELECTRICAL CONTACT BETWEEN A SEMICONDUCTOR FILM AND A BULK HANDLE WAFER, AND RESULTING STRUCTURE

(71) Applicant: STMicroelectronics (Crolles 2) SAS, Crolles (FR)

(72) Inventors: Didier Dutartre, Meylan (FR); Jean-Pierre Carrere, Grenoble (FR); Jean-Luc Huguenin, Grenoble (FR); Clement Pribat, Villard Bonnot (FR); Sarah Kuster, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 117 days.

(21) Appl. No.: 17/228,164

(22) Filed: Apr. 12, 2021

(65) Prior Publication Data
US 2021/0233811 A1 Jul. 29, 2021

Related U.S. Application Data

(62) Division of application No. 16/384,147, filed on Apr. 15, 2019, now Pat. No. 10,978,340, which is a
(Continued)

(51) Int. Cl.
*H01L 21/768* (2006.01)
*H01L 21/82* (2006.01)
*H01L 21/84* (2006.01)
*H01L 21/762* (2006.01)
*H01L 21/74* (2006.01)
(Continued)

(52) U.S. Cl.
CPC ...... *H01L 21/76877* (2013.01); *H01L 21/743* (2013.01); *H01L 21/7624* (2013.01); *H01L 21/823475* (2013.01); *H01L 21/84* (2013.01); *H01L 27/1207* (2013.01); *H01L 29/0649* (2013.01); *H01L 21/0262* (2013.01); *H01L 21/02532* (2013.01)

(58) Field of Classification Search
CPC ............. H01L 21/76877; H01L 21/743; H01L 21/7624; H01L 21/823475; H01L 21/84; H01L 21/02532; H01L 21/0262
See application file for complete search history.

(56) References Cited

U.S. PATENT DOCUMENTS

6,121,102 A * 9/2000 Norstrom .......... H01L 21/76224
257/E21.375
6,936,910 B2 * 8/2005 Ellis-Monaghan .........................
H01L 21/76264
257/E21.372
(Continued)

*Primary Examiner* — Omar F Mojaddedi
(74) *Attorney, Agent, or Firm* — Crowe & Dunlevy (57) ABSTRACT

A silicon on insulator substrate includes a semiconductor bulk handle wafer, an insulating layer on said semiconductor bulk handle wafer and a semiconductor film on said insulating layer. An opening extends completely through the semiconductor film and insulating layer to expose a surface of the semiconductor bulk handle wafer. Epitaxial material fills the opening and extends on said semiconductor film, with the epitaxial material and semiconductor film forming a thick semiconductor film. A trench isolation surrounds a region of the thick semiconductor film to define an electrical contact made to the semiconductor bulk handle wafer through the opening.

15 Claims, 7 Drawing Sheets

Related U.S. Application Data division of application No. 15/093,416, filed on Apr. 7, 2016, now Pat. No. 10,262,898.

(51) Int. Cl.
*H01L 21/02* (2006.01)
*H01L 29/06* (2006.01)
*H01L 27/12* (2006.01)
*H01L 21/8234* (2006.01)

(56) References Cited

U.S. PATENT DOCUMENTS

| | | | |
|---|---|---|---|
| 7,339,254 B1 * | 3/2008 | Kempf | H01L 21/76264 257/350 |
| 7,618,865 B2 * | 11/2009 | Johansson | H01L 21/8249 438/149 |
| 2008/0079039 A1 | 4/2008 | Schwan et al. | |
| 2009/0008711 A1 | 1/2009 | Wei et al. | |
| 2010/0096701 A1 | 4/2010 | Yoo | |
| 2013/0256701 A1 | 10/2013 | Yang et al. | |
| 2015/0255537 A1 * | 9/2015 | Pigott | H01L 21/76286 438/424 |
| 2016/0163583 A1 * | 6/2016 | Liu | H01L 21/823878 438/430 |
| 2016/0163861 A1 | 6/2016 | Park et al. | |

* cited by examiner

METHOD FOR FORMING AN ELECTRICAL CONTACT BETWEEN A SEMICONDUCTOR FILM AND A BULK HANDLE WAFER, AND RESULTING STRUCTURE

CROSS REFERENCE TO RELATED APPLICATIONS

This application is a divisional of U.S. patent application Ser. No. 16/384,147 filed Apr. 15, 2019, now U.S. Pat. No. 10,978,340, which is a divisional of U.S. patent application Ser. No. 15/093,416 filed Apr. 7, 2016, now U.S. Pat. No. 10,262,898, the disclosures of which are hereby incorporated by reference.

TECHNICAL FIELD

The present invention relates to integrated circuits and, in particular, to a silicon on insulator (SOI) substrate and the forming of an electrical contact between the semiconductor film and supporting bulk handle wafer of the SOI substrate.

BACKGROUND

Figure 1:
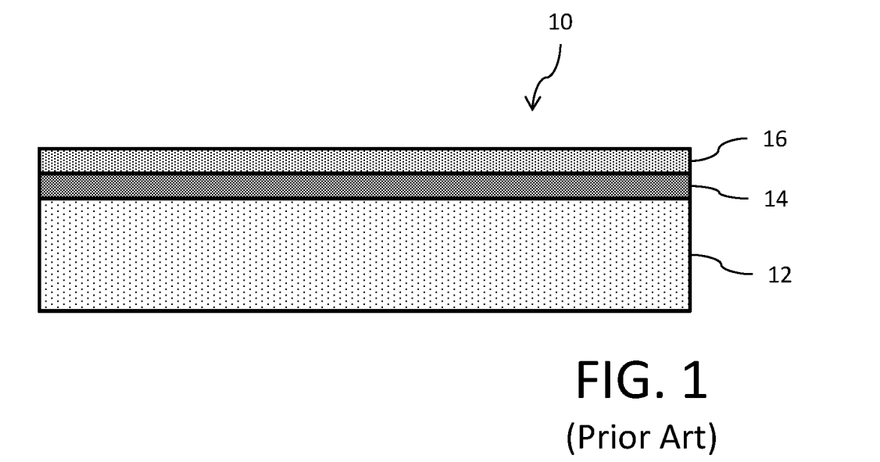
FIG. 1 shows a conventional silicon on insulator substrate.

The use of silicon on insulator (SOI) substrates in the fabrication of integrated circuit devices is well known in the art. With reference to FIG. 1, an SOI substrate 10 typically comprises a semiconductor bulk handle wafer 12, an insulating layer 14 and a semiconductor film 16 arranged in a stack. The semiconductor film 16 may be doped in accordance with the application, or alternatively may be un-doped in which case the SOI substrate 10 is of the "fully-depleted" type. The semiconductor film 16 may, for example, have a thickness of 35-70 nm. The insulating layer 14 is commonly referred to in the art as a buried oxide (BOX) layer.

Figure 2:
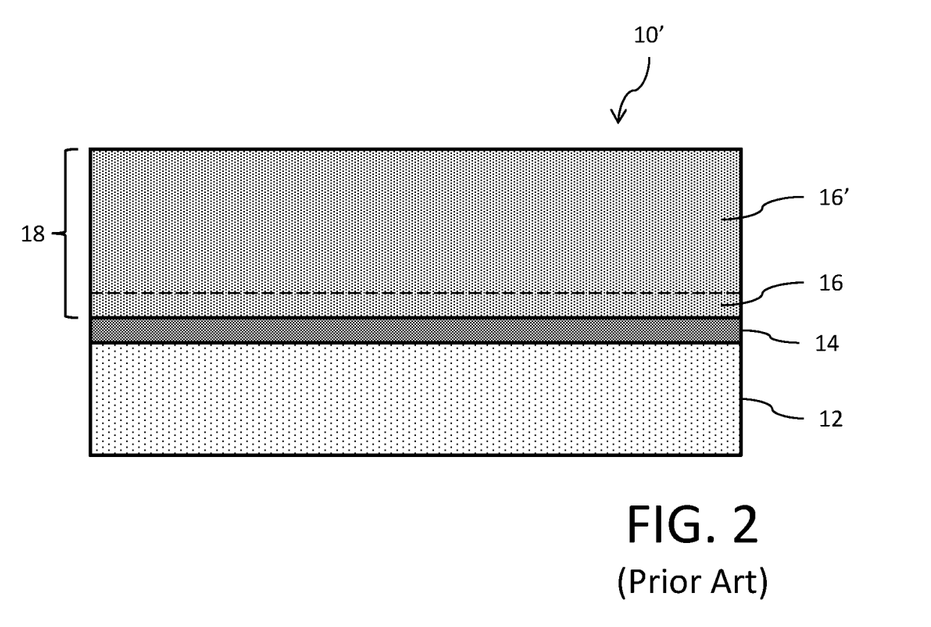
FIG. 2 shows a conventional thick silicon on insulator substrate.

It is common for certain integrated circuit devices, such as those used in imaging where the semiconductor film 16 is fabricated to include a photosensitive region, for epitaxial growth processing to be used to increase the thickness of the semiconductor film. For example, a thick semiconductor film 18 with a thickness of 2-20 μm is not uncommon. An example of such a thick SOI substrate 10' is shown in FIG. 2 with the thick semiconductor film 18 including the epitaxial portion 16' over the semiconductor film 16. The epitaxial portion 16' may be doped in accordance with the application.

Figure 3:
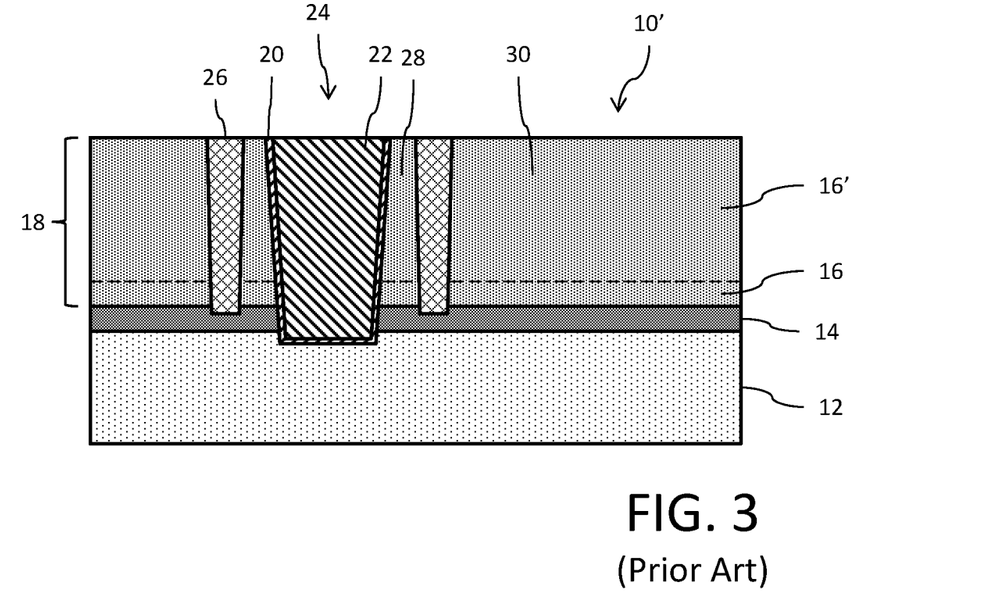
FIGS. 3-4 show prior art bulk contact structures for use in making electrical contact to the semiconductor bulk handle wafer of the thick silicon on insulator substrate of FIG. 2.

In a number of circuit applications, it is necessary to effectuate voltage control over the biasing of the semiconductor bulk handle wafer 12. FIG. 3 illustrates one known method and structure for making an electrical contact to the semiconductor bulk handle wafer 12. In this implementation, a deep etch is made from the front surface of the thick semiconductor film 18, with the deep etch extending through the epitaxial portion 16', the semiconductor film 16 and the insulating layer 14 and further partially extending into the semiconductor bulk handle wafer 12. The opening formed by the deep etch is lined with a barrier liner 20 and filled with a metal fill 22. The barrier liner 20 may, for example, comprise a Titanium or Tantalum Nitride material and the metal fill 22 may, for example, comprise a copper material to form a conductive bulk contact 24. The material of the barrier liner 22 is selected to prevent contamination of the semiconductor material by the metal fill 22. Deep trench isolation (DTI) structures 26 may be formed to surround the bulk contact 24 so as to isolate the region 28 of the thick semiconductor film 18 where the bulk contact 24 is formed from the active region 30 of the thick semiconductor film 18 where integrated circuit structures are fabricated. The process for forming the DTI structures 26 utilizes a deep etch that is made from the front surface of the thick semiconductor film 18, with the deep etch extending through the epitaxial portion 16' and the semiconductor film 16 and further partially extending into the insulating layer 14. The opening formed by this deep etch is then filled with an insulating material.

Figure 4:
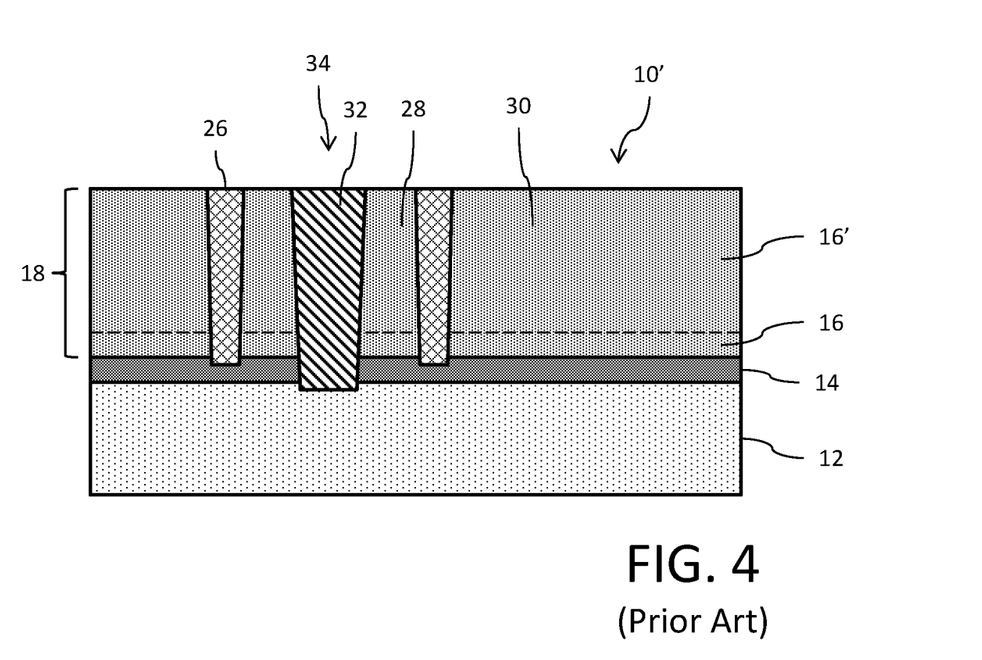

FIG. 4 illustrates another known method for making an electrical contact to the semiconductor bulk handle wafer 12. In this implementation, a deep etch is made from the front surface of the thick semiconductor film 18 extending through the epitaxial portion 16', the semiconductor film 16 and the insulating layer 14 and partially extending into the semiconductor bulk handle wafer 12. The opening formed by the deep etch is then filled with a metal plug 32. The metal plug 32 may, for example, comprise tungsten material to form a bulk contact 34. Deep trench isolation (DTI) structures 26 may be formed to surround the bulk contact 34 so as to isolate the region 28 of the thick semiconductor film 18 where the bulk contact 34 is formed from the active region 30 of the thick semiconductor film 18 where integrated circuit structures are fabricated. The process for forming the DTI structures 26 utilizes a deep etch that is made from the front surface of the thick semiconductor film 18, with the deep etch extending through the epitaxial portion 16' and the semiconductor film 16 and further partially extending into the insulating layer 14. The opening formed by this deep etch is then filled with an insulating material.

The bulk contacts and methods of making described above suffer from a number of drawbacks including: a need to use a thick resist or hard mask to make the deep etch; a need to control surface flatness of the thick semiconductor film 18; a need to avoid contamination of the thick semiconductor film 18; thermal budget limitations that affect process steps; a challenging aspect ratio for the deep etch; and possible introduction of undesired stress.

There is accordingly a need in the art to provide an improved process for forming a contact to the semiconductor bulk handle wafer of an SOI substrate.

SUMMARY

In an embodiment, an integrated circuit comprises: a semiconductor bulk handle wafer; an insulating layer on said semiconductor bulk handle wafer; a semiconductor film on said insulating layer; an opening extending completely through the semiconductor film and insulating layer to expose a surface of the semiconductor bulk handle wafer; epitaxial material filling said opening and extending on said semiconductor film; the epitaxial material and semiconductor film forming a thick semiconductor film; and a trench isolation surrounding a region of the thick semiconductor film to define an electrical contact made to the semiconductor bulk handle wafer through said opening.

In an embodiment, a process comprises: forming an opening extending completely through a semiconductor film and an insulating layer to expose a surface of a semiconductor bulk handle wafer wherein the insulating layer is on said semiconductor bulk handle wafer and the semiconductor film is on said insulating layer; epitaxially growing semiconductor material to fill said opening and extend on said semiconductor film, the epitaxial material and semiconductor film forming a thick semiconductor film; and providing a trench isolation surrounding a region of the thick semiconductor film to define an electrical contact made to the semiconductor bulk handle wafer through said opening.

In an embodiment, an integrated circuit comprises: a semiconductor bulk handle wafer; an insulating layer on said semiconductor bulk handle wafer; a semiconductor film on said insulating layer; an opening extending completely through the semiconductor film and insulating layer to expose a surface of the semiconductor bulk handle wafer; epitaxial material filling said opening; and a trench isolation surrounding a region of the semiconductor film and epitaxial material to define an electrical contact made to the semiconductor bulk handle wafer through said opening.

In an embodiment, a process comprises: forming an opening extending completely through a semiconductor film and an insulating layer to expose a surface of a semiconductor bulk handle wafer wherein the insulating layer is on said semiconductor bulk handle wafer and a remaining portion of the semiconductor film is on said insulating layer; removing portions of the insulating layer under the remaining portion of the semiconductor film to form a laterally extended opening; epitaxially baking to round said remaining portion of the semiconductor film to fill the laterally extended opening and seal an edge of the insulating layer across an entire thickness of the insulating layer; epitaxially growing semiconductor material to fill said opening at least to a level of a top of said remaining portion of the semiconductor film; and providing a trench isolation surrounding a region of the semiconductor film and the epitaxially grown semiconductor material in said opening to define an electrical contact made to the semiconductor bulk handle wafer that extends through said opening.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 5-9 showing an embodiment for, and the process for making, an epitaxial material bulk contact structure for use in making electrical contact to the semiconductor bulk handle wafer of a thick silicon on insulator (SOI) substrate. It will be understood that FIGS. 5-9 do not necessarily illustrate the structures drawn to scale.

Figure 6:
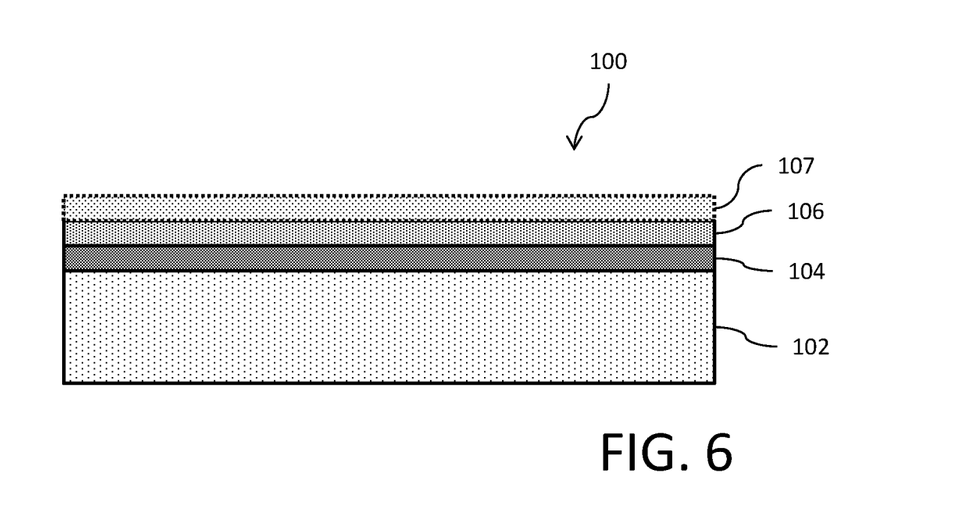
FIGS. 6-9 show process steps for forming the epitaxial material bulk contact structure of FIG. 5.
Figure 7:
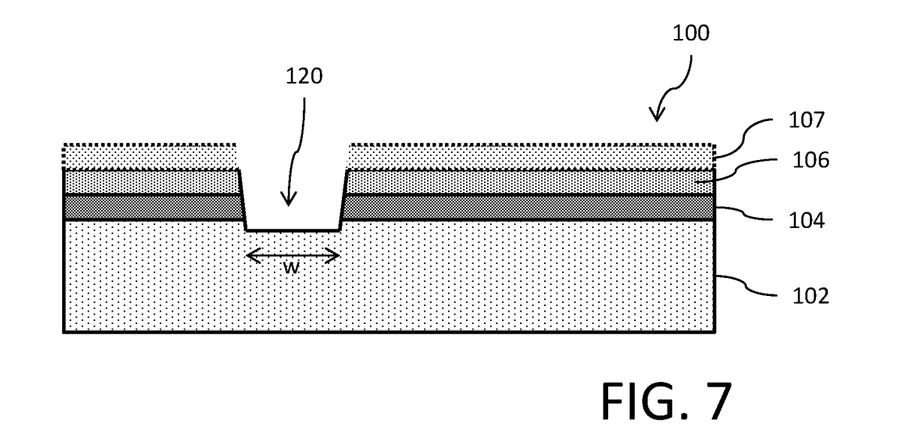

The process starts as shown in FIG. 6 with an SOI substrate 100 comprising a semiconductor bulk handle wafer 102, an insulating layer 104 and a semiconductor film 106 arranged in a stack. The semiconductor film 106 may be doped in accordance with the application, or alternatively may be un-doped in which case the SOI substrate 100 is of the "fully-depleted" type. The semiconductor film 106 may, for example, have a thickness of 35-70 nm. The insulating layer 104 is commonly referred to in the art as a buried oxide (BOX) layer. The insulating layer 104 may, for example, have a thickness of 20-50 nm.

As an optional feature, an epitaxial layer 107 may be grown on the top surface of the semiconductor film 106.

An opening 120 is formed from the front surface of the semiconductor film 106, with that opening extending completely through the film 106 (and optional epitaxial layer 107, if present) and the insulating layer 104 and further partially extending into the semiconductor bulk handle wafer 102. See, FIG. 7. A pad oxide layer may be used to protect the top surface of the semiconductor film 106 during the etch that is used for form the opening 120. In an embodiment, the etch process may, for example, comprise a reactive ion etch (RIE) process. The opening 120 may, for example, have a width w of 0.2-1 μm (and in particular may have a width of 0.2-0.4 μm in connection with a process where subsequent epitaxial growth has a thickness of about 4 μm).

Figure 8:
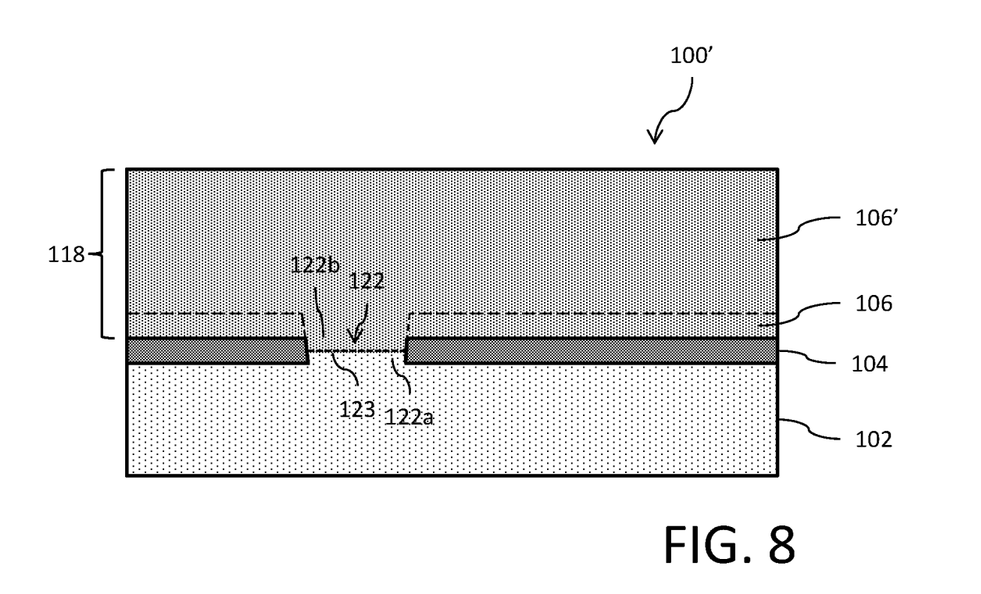

An epitaxial growth process is then used to form a thick SOI substrate 100' as shown in FIG. 8. For example, a thick semiconductor film 118 with a thickness of 2-20 μm is not uncommon. An example of such a thick SOI substrate 100' is shown in FIG. 8 with the thick semiconductor film 118 including the epitaxial portion 106' over the semiconductor film 106 (and optional epitaxial layer 107, if present, not shown in FIG. 8). The epitaxial portion 106' may be doped (for example, in situ) in accordance with the application. The thick semiconductor film 118 further includes a region 122 of epitaxial material that fills the opening 120, this region 122 is formed by a combination of epitaxial material 122a grown from the semiconductor bulk handle wafer 102 and epitaxial material 122b grown from the semiconductor film 106. The interface 123 between the epitaxially grown materials 122a and 122b is representative only, it being understood that the location and shape of the interface 123 is dependent on a number of factors. Indeed, in implementations where the same semiconductor material (for example, silicon) is used for both the semiconductor bulk handle wafer 102 and the semiconductor film 106 there will effectively be no interface at all.

The epitaxial process is preferably a high temperature process (temperature greater than 1000° C.) using $H_2$ as a carrier gas and chlorinated gas as a silicon precursor. For example, $SiHCl_3$ at atmospheric pressure may be used. Alternatively, $SiH_2Cl_2$ at a reduced pressure (20-100 torr) may be used. In an alternative embodiment, the process may begin at a lower temperature (for example, 900-1000° C.) and then later transition to the high temperature.

In situations where there is a relatively thick insulating layer 104, the epitaxial growth process may be performed in multiple steps. For example, for insulator thickness greater than 50 nm, the following process may be used: after the etching to form opening 120, the oxide is not removed; the first epitaxial growth step comprises a low temperature selective epitaxy to grow the material 122a to fill the holes; the oxide is then removed using a wet process; and then the second epitaxial growth step comprising a high temperature epitaxy is performed to grow the material 122b providing the portion 106'.

Although the top surface of the thick semiconductor film 118 is illustrated in FIG. 8 as a planar surface, it will be understood that the epitaxial growth process may not produce such a planar surface, especially in the area above the location of the opening 120. If a planar surface is desired, a suitable chemical mechanical polishing operation may be performed to produce the planar surface prior to performing further manufacturing steps.

Figure 9:
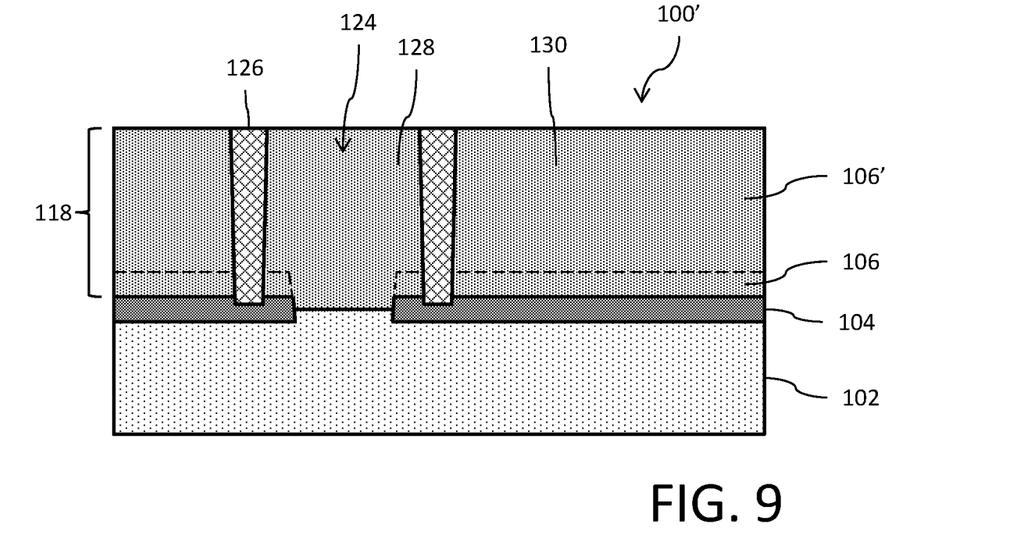

Next, deep trench isolation (DTI) structures 126 are formed to surround a region 128 of the thick semiconductor film 118 forming a bulk contact 124 so that region 128 is isolated from an active region 130 of the thick semiconductor film 118 where integrated circuit structures (wells, source regions, drain regions; photodiodes, etc.) 140 are fabricated. The result is shown in FIG. 9. It will be understood that the DTI structures 126 may be formed at any suitable time relative to the fabrication of the integrated circuit structures in the active region 130. In the case of an integrated circuit for imaging applications, such a circuit comprising pixel elements formed in the active region 130, the DTI structures 126 can advantageously be formed at the same time as the DTI which provides for pixel isolation.

Figure 5:
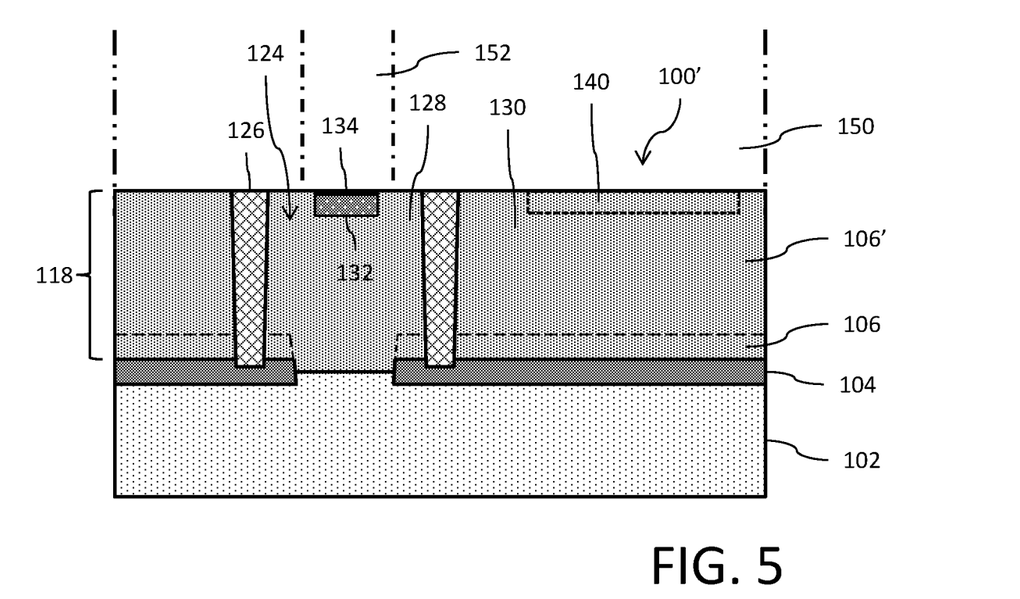
FIG. 5 shows an embodiment for an epitaxial material bulk contact structure for use in making electrical contact to the semiconductor bulk handle wafer of a thick silicon on insulator substrate.

If needed, a more highly doped region 132 is provided at the top surface of the bulk contact 124 to support electrical connection as shown in FIG. 5. The more highly doped region 132 may include a silicide layer 134. A metal line or other metal contact may then be made to make electrical connection to the bulk contact 124.

In a preferred implementation shown in FIG. 5, a pre-metal dielectric layer 150 is deposited over the thick semiconductor film 118 and openings 152 are made extending through the pre-metal dielectric layer 150 to permit the formation of contacts to electrically connect to the bulk contact 124/region 128.

Reference is now made to FIGS. 10-15 showing an embodiment for, and the process for making, an epitaxial material bulk contact structure for use in making electrical contact to the semiconductor bulk handle wafer of a thick silicon on insulator (SOI) substrate. It will be understood that FIGS. 10-15 do not necessarily illustrate the structures drawn to scale.

Figure 11:
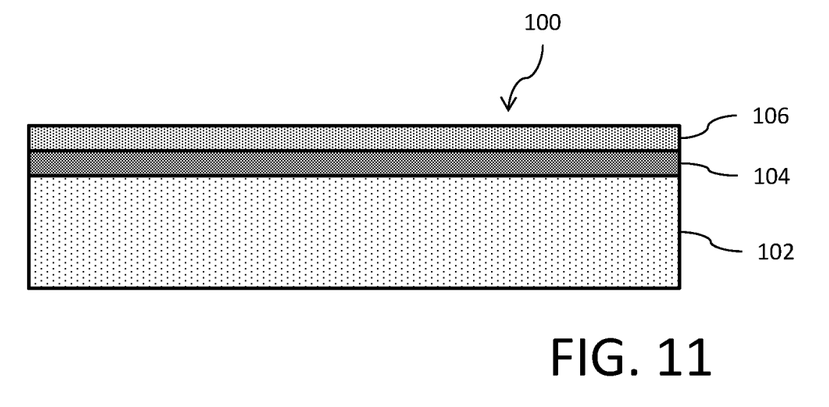
FIGS. 11-15 show process steps for forming the epitaxial material bulk contact structure of FIG. 10.
Figure 12:
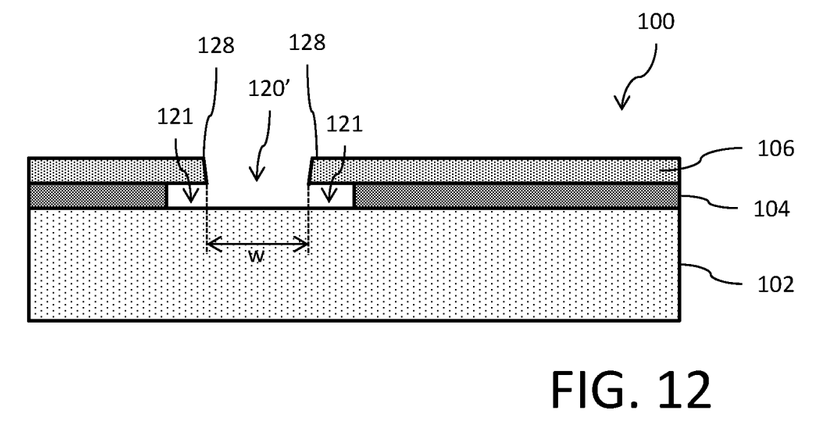

The process starts as shown in FIG. 11 with an SOI substrate 100 comprising a semiconductor bulk handle wafer 102, an insulating layer 104 and a semiconductor film 106 arranged in a stack. The semiconductor film 106 may be doped in accordance with the application, or alternatively may be un-doped in which case the SOI substrate 100 is of the "fully-depleted" type. The semiconductor film 106 may, for example, have a thickness of 35-70 nm. The insulating layer 104 is commonly referred to in the art as a buried oxide (BOX) layer. The insulating layer 104 may, for example, have a thickness of 20-40 nm.

Although not explicitly illustrated, it will be understood that the optional epitaxial layer 107 (see, FIG. 6) may be grown on the top surface of the semiconductor film 106 in FIG. 11.

An opening 120' is formed from the front surface of the semiconductor film 106 that extends completely through the film 106 and the insulating layer 104 (and may partially extend into the semiconductor bulk handle wafer 102). See, FIG. 12. The opening 120' includes undercut openings 121 where portions of the insulating layer 104 under extension regions 128 of the film 106 are removed. A pad oxide layer may be used to protect the top surface of the semiconductor film 106 during the etch that is used for form the openings 120' and 121. In an embodiment, the etch process may, for example, comprise a reactive ion etch (RIE) process. The opening 120' may, for example, have a width w of 0.2-1 μm (and in particular may have a width of 0.2-0.4 μm in connection with a process where subsequent epitaxial growth has a thickness of about 4 μm), and the undercut openings 121 may extend under the extension regions 128 for approximately two times the thickness of insulating layer 104.

Figure 13:
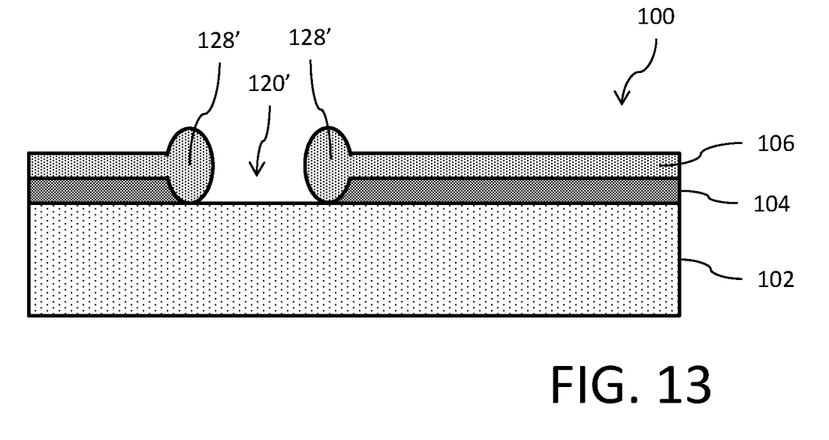

An epitaxial bake is then performed which produces a rounding of the extension regions 128 to form junction regions 128' connecting the semiconductor film 106 to the semiconductor bulk handle wafer 102. The bake step may, for example, comprise a thermal treatment of the wafer performed following a temperature ramp from a temperature below 100° C. up to a temperature of around 1000° C., with no active gas so that no silicon growth occurs. An advantage of performing this process step is that the junction regions 128' effectively seal the side wall edge of the insulating layer 104 that was exposed within the undercut openings 121. The insulating layer 104 will accordingly not be exposed to subsequent process steps. The result is shown in FIG. 13. Processing to remove native oxide from surfaces may be performed prior to subsequent epitaxial growth.

Figure 14:
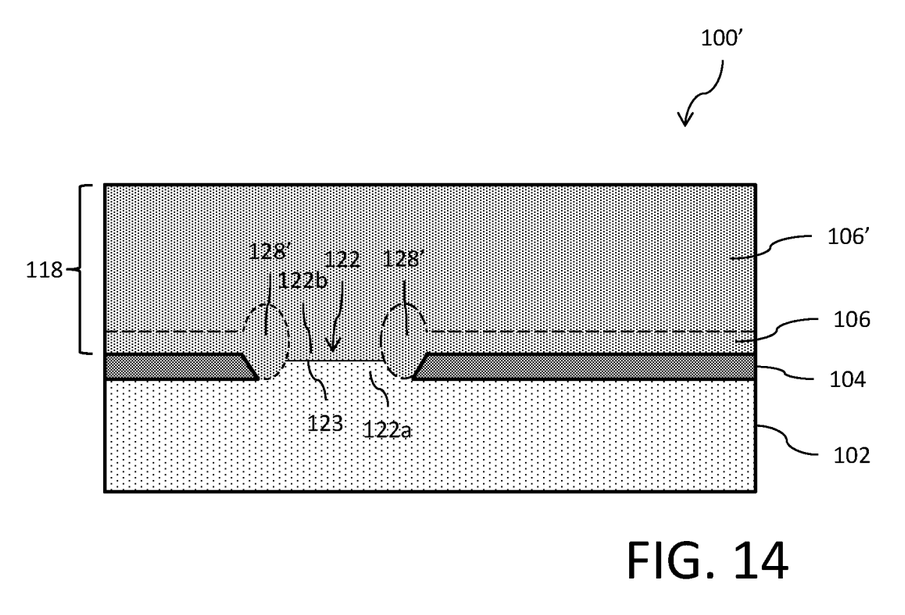

An epitaxial growth process is then used to form a thick SOI substrate 100' as shown in FIG. 14. For example, a thick semiconductor film 118 with a thickness of 2-20 μm is not uncommon. An example of such a thick SOI substrate 100' is shown in FIG. 14 with the thick semiconductor film 118 including the epitaxial portion 106' over the semiconductor film 106 with junction regions 128'. The epitaxial portion 106' may be doped (for example, in situ) in accordance with the application. The thick semiconductor film 118 further includes a region 122 of epitaxial material that fills the opening 120, this region 122 being formed by a combination of epitaxial material 122a grown from the semiconductor bulk handle wafer 102 and epitaxial material 122b grown from the semiconductor film 106. The interface (junction) 123 between the epitaxially grown materials 122a and 122b is representative only, it being understood that the location and shape of the interface 123 is dependent on a number of factors. Indeed, in implementations where the same semiconductor material (for example, silicon) is used for both the semiconductor bulk handle wafer 102 and the semiconductor film 106 there will effectively be no interface at all.

The epitaxial process is preferably a high temperature process (temperature greater than 1000° C.) using $H_2$ as a carrier gas and chlorinated gas as a silicon precursor. For example, $SiHCl_3$ at atmospheric pressure may be used. Alternatively, $SiH_2Cl_2$ at a reduced pressure (20-100 torr) may be used. In an alternative embodiment, the process may begin at a lower temperature (for example, 900-1000° C.).

Although the top surface of the thick semiconductor film 118 is illustrated in FIG. 14 as a planar surface, it will be understood that the epitaxial growth process may not produce such a planar surface, especially in the area above the location of the opening 120. If a planar surface is desired, a suitable chemical mechanical polishing operation may be performed to produce the planar surface.

Figure 15:
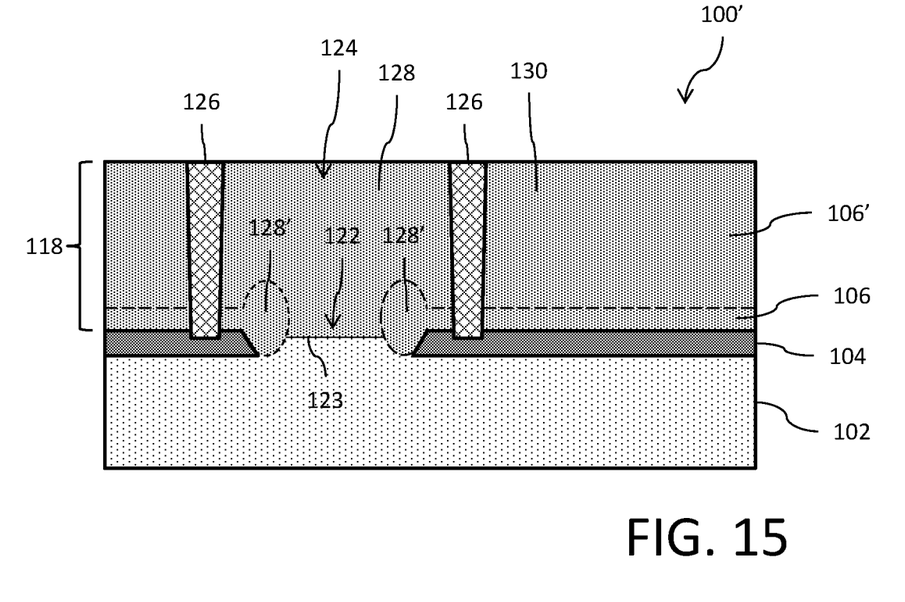

Next, deep trench isolation (DTI) structures 126 are formed to surround a region 128 of the thick semiconductor film 118 forming a bulk contact 124 so that the region 128 is isolated from an active region 130 of the thick semiconductor film 118 where integrated circuit structures (wells, source regions, drain regions; photodiodes, etc.) 140 are fabricated. The result is shown in FIG. 15. It will be understood that the DTI structures 126 may be formed at any suitable time relative to the fabrication of the integrated circuit structures in the active region 130. In the case of an integrated circuit for imaging applications, such a circuit comprising pixel elements formed in the active region 130, the DTI structures 126 can advantageously be formed at the same time as the DTI which provides for pixel isolation.

Figure 10:
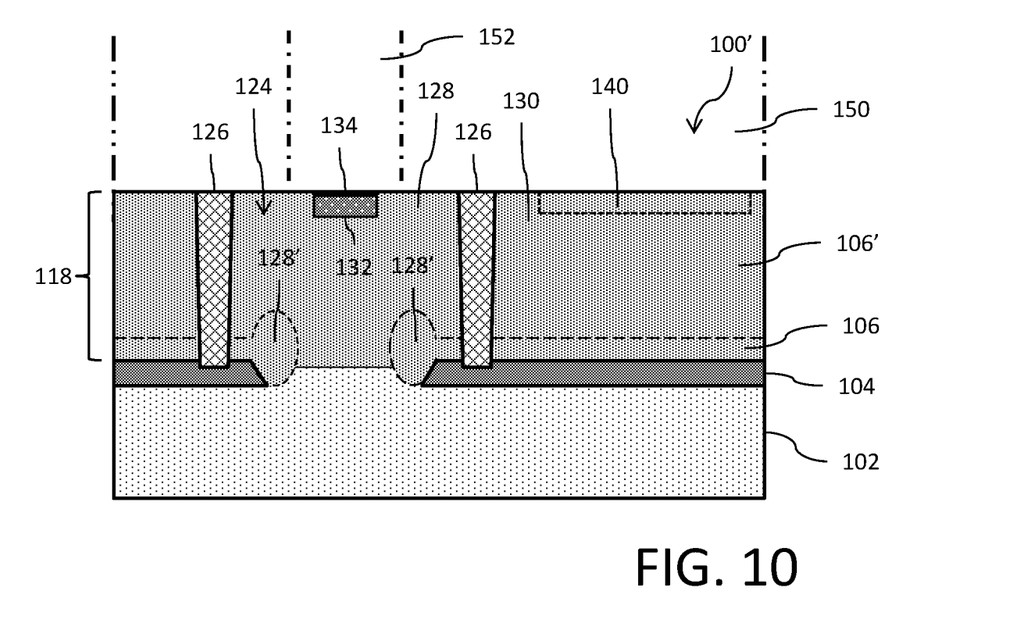
FIG. 10 shows an embodiment for an epitaxial material bulk contact structure for use in making electrical contact to the semiconductor bulk handle wafer of a thick silicon on insulator substrate.

If needed, a more highly doped region 132 is provided at the top surface of the bulk contact 124 to support electrical connection as shown in FIG. 10. The more highly doped region 132 may include a silicide layer 134. A metal line or other metal contact may then be made to make electrical connection to the bulk contact 124.

In a preferred implementation shown in FIG. 10, a pre-metal dielectric layer 150 is deposited over the thick semiconductor film 118 and openings 152 are made extending through the pre-metal dielectric layer 150 to permit the formation of contacts to electrically connect to the bulk contact 124/region 128.

A number of advantages accrue for the processes and structures described above: the manufacturing process has a simple process flow; a number of steps of conventional processing for bulk contact formation are simplified or eliminated; the proposed process leads to a flatter surface; stress is minimized because monocrystalline silicon is inserted into an opening of monocrystalline silicon; contamination is avoided; the process is compatible with the use of very thick silicon films for SOI substrates; the process is compatible with a broad range of thicknesses (for example, 15-300 nm) of the insulating layer 104.

It will be understood that the bulk contact 124 (provided by region 128), because it is formed of doped epitaxial semiconductor material, will not provide a low resistivity contact to the semiconductor bulk handle wafer 102. Additionally, there may exist crystalline defects at the interface (junction) 123 between the epitaxially grown materials. However, these facts are offset by the advantages as described herein.

In a preferred implementation, the width w of the openings 120/120' is less than one-fifth the thickness of the epitaxial portion 106'. Larger etched patterns are added after the growth of the epitaxial portion 106' is completed. This ensures generation of a surface morphology for the thick semiconductor film 118 that is suitable for overlay.

In an embodiment, a depth of the portion of the etch that extends partially into the semiconductor bulk handle wafer 102 may be about one-half a combined thickness of the semiconductor film 106 and insulating layer 104.

In an embodiment, the thickness of the semiconductor film 106 is greater than one-half the side of an etched pattern.

In an embodiment, the epitaxial growth process may be performed using a first deposition and a second deposition separated by a wet oxide etch. Such a two-step epitaxy process may be advantageously used in connection with a relatively thick insulating layer 104 (for example, of 50-100 nm). The first epitaxial step is performed when epitaxial portion 106' is protected by a pad oxide. As a consequence, epitaxial growth occurs only in the region 122 that fills the opening 120 (for example, material 122a). Next, the pad oxide is removed by a wet etch process. A second epitaxial step is then performed. This second epitaxy allows for the formation of a thick silicon layer 106' (which may include material 122b). As a result of this method, there are minimal crystal defects at the interface (junction) 123 between the epitaxially grown silicon materials.

In an embodiment, the etched patterns produced are aligned along a <100> crystal orientation of the semiconductor film 106.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A process, comprising:
forming an opening extending completely through a semiconductor film and an insulating layer to expose a surface of a semiconductor bulk handle wafer wherein the insulating layer is on said semiconductor bulk handle wafer and a remaining portion of the semiconductor film is on said insulating layer;
removing portions of the insulating layer under the remaining portion of the semiconductor film to form a laterally extended opening;
epitaxially baking to round said remaining portion of the semiconductor film to fill the laterally extended opening and seal an edge of the insulating layer across an entire thickness of the insulating layer;
epitaxially growing semiconductor material to fill said opening at least to a level of a top of said remaining portion of the semiconductor film; and
providing a trench isolation surrounding a region of the semiconductor film and the epitaxially grown semiconductor material in said opening to define an electrical contact made to the semiconductor bulk handle wafer that extends through said opening.

2. The process of claim 1, further comprising:
providing a pre-metal dielectric layer on the semiconductor film; and
forming an opening extending through said pre-metal dielectric layer to support a contact made to said electrical contact.

3. The process of claim 1, further comprising forming a heavily doped region at an upper surface of the electrical contact.

4. The process of claim 3, further comprising siliciding at least a portion of the heavily doped region at the upper surface.

5. The process of claim 1, wherein the trench isolation isolates the electrical contact from an active region of the semiconductor film.

6. The process of claim 5, further comprising forming integrated circuit structures in the active region.

7. A process, comprising:
forming an opening in a silicon on insulator (SOI) substrate that extends through a semiconductor film and an insulating layer of the SOI substrate to reach a semiconductor substrate layer;
laterally extending the opening by removing portion of the insulating layer;
processing the semiconductor film at the laterally extended opening to cause the semiconductor film to seal an edge of the insulating layer across an entire thickness of the insulating layer;
epitaxially growing semiconductor material from the semiconductor substrate layer to fill said opening between portions of the semiconductor film which seal the edge of the insulating layer; and
forming a trench isolation surrounding a region of the semiconductor film which includes said portions of the semiconductor film to define an electrical contact to the semiconductor substrate layer that is made at least from the epitaxially grown semiconductor material.

8. The process of claim 7, wherein the epitaxially grown semiconductor material has a thickness at least as thick as a thickness of the semiconductor film.

9. The process of claim 7, wherein laterally extending the opening exposes an underside surface of the semiconductor film.

10. The process of claim 9, wherein processing the semiconductor film comprises epitaxially processing the semiconductor film to form rounded portions at a perimeter of the opening which are in contact with the edge of the insulating layer.

11. The process of claim 7, wherein forming the trench isolation produces an insulating structure that extends completely through the semiconductor film, and wherein the trench isolation isolates the electrical contact from an active region of the semiconductor film.

12. The process of claim 11, further comprising forming integrated circuit structures in the active region.

13. The process of claim 7, further comprising:
providing a pre-metal dielectric layer on the semiconductor film; and
forming an opening extending through said pre-metal dielectric layer to support a contact made to said electrical contact.

14. The process of claim 7, further comprising forming a heavily doped region at an upper surface of the electrical contact.

15. The process of claim 14, further comprising siliciding at least a portion of the heavily doped region at the upper surface.

* * * * *